(12) United States Patent
Takamine

(10) Patent No.: US 9,806,693 B2
(45) Date of Patent: Oct. 31, 2017

(54) DUPLEXER WITH A LADDER FILTER PORTION AND A SPECIFICALLY CONNECTED CAPACITOR OR ELASTIC WAVE RESONATOR

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 67 days.

(21) Appl. No.: 15/051,828

(22) Filed: Feb. 24, 2016

(65) Prior Publication Data

US 2016/0173062 A1 Jun. 16, 2016

Related U.S. Application Data

(63) Continuation of application No. PCT/JP2014/067180, filed on Jun. 27, 2014.

(30) Foreign Application Priority Data

Sep. 17, 2013 (JP) .................................. 2013-191982

(51) Int. Cl.
*H03H 9/72* (2006.01)
*H03H 9/64* (2006.01)
*H03H 9/00* (2006.01)
*H03H 9/46* (2006.01)

(52) U.S. Cl.
CPC .......... *H03H 9/725* (2013.01); *H03H 9/6433* (2013.01); *H03H 9/6479* (2013.01);
(Continued)

(58) Field of Classification Search
CPC ...... H03H 9/0009; H03H 9/0028; H03H 9/46; H03H 9/54; H03H 9/542; H03H 9/64;
(Continued)

(56) References Cited

U.S. PATENT DOCUMENTS

| 2004/0080384 A1 | 4/2004 | Takeda |
| 2008/0007370 A1* | 1/2008 | Matsumoto .......... H03H 9/0061 333/194 |

(Continued)

FOREIGN PATENT DOCUMENTS

| JP | 2004-96250 A | 3/2004 |
| JP | 2006-186433 A | 7/2006 |

(Continued)

OTHER PUBLICATIONS

Official Communication issued in International Application PCT/JP2014/067180, dated Sep. 9, 2014.

*Primary Examiner* — Barbara Summons
(74) *Attorney, Agent, or Firm* — Keating & Bennett, LLP

(57) ABSTRACT

A duplexer includes a transmission filter with a ladder circuit configuration and a reception filter including a ladder filter portion connected to an antenna terminal and a longitudinally coupled resonator-type surface acoustic wave filter. In the transmission filter, a coupling capacitor is connected between an end portion of an inductor nearer to parallel arm resonators and a wiring line connecting the series arm resonators of the ladder filter portion to each other in the reception filter.

18 Claims, 9 Drawing Sheets

(52) U.S. Cl.
CPC ........... *H03H 9/6483* (2013.01); *H03H 9/009* (2013.01); *H03H 9/0009* (2013.01); *H03H 9/46* (2013.01); *H03H 9/6436* (2013.01)

(58) Field of Classification Search
CPC .. H03H 9/6433; H03H 9/6436; H03H 9/6479; H03H 9/6483; H03H 9/70; H03H 9/706; H03H 9/725
USPC ........................................................ 333/133
See application file for complete search history.

(56) References Cited

U.S. PATENT DOCUMENTS

| | | | |
|---|---|---|---|
| 2010/0244979 A1* | 9/2010 | Matsuda | H03H 9/0571 333/100 |
| 2011/0018654 A1* | 1/2011 | Bradley | H03H 9/706 333/133 |
| 2012/0313724 A1 | 12/2012 | Tsurunari et al. | |
| 2013/0307639 A1 | 11/2013 | Mori | |
| 2014/0010122 A1* | 1/2014 | Krems | H03H 9/6483 370/277 |
| 2016/0173061 A1* | 6/2016 | Takamine | H03H 9/725 333/133 |

FOREIGN PATENT DOCUMENTS

| | | | |
|---|---|---|---|
| JP | 2007-258832 A | | 10/2007 |
| JP | 2010-192974 A | * | 9/2010 |
| WO | 2011/061904 A1 | | 5/2011 |
| WO | 2012/063517 A1 | | 5/2012 |
| WO | 2012/105337 A1 | | 8/2012 |

* cited by examiner

DUPLEXER WITH A LADDER FILTER PORTION AND A SPECIFICALLY CONNECTED CAPACITOR OR ELASTIC WAVE RESONATOR

BACKGROUND OF THE INVENTION

1. Field of the Invention

The present invention relates to duplexers used in, for example, mobile communication terminals, and more specifically, to a duplexer that includes a transmission filter with a ladder circuit configuration including a plurality of elastic wave resonators.

2. Description of the Related Art

To date, a duplexer that includes a surface acoustic wave filter has been widely used in, for example, mobile communication terminals. For example, Japanese Unexamined Patent Application Publication No. 2004-96250 described below discloses a surface acoustic wave filter having a ladder circuit configuration, as a transmission filter of a duplexer. In Japanese Unexamined Patent Application Publication No. 2004-96250, an antenna terminal, a transmission terminal, and a ground terminal are provided on a piezoelectric substrate. A transmission filter having a ladder circuit configuration is arranged so as to be connected between the transmission terminal and the antenna terminal and connected to the ground terminal. Here, a routing wiring line connected to the ground terminal is arranged between the ground terminal and the antenna terminal in such a manner as to be close to the antenna terminal. As a result, a coupling capacitor Cg is formed. It is stated that this coupling capacitor Cg allows attenuation in the vicinity of the high-frequency side of the pass band to be increased.

Attenuation in the vicinity of the high-frequency side of the pass band of a transmission filter can be increased by providing a coupling capacitor as disclosed in Japanese Unexamined Patent Application Publication No. 2004-96250.

On the other hand, a filter device in which a longitudinally coupled resonator-type elastic wave filter is connected to the antenna terminal through a one-port elastic wave resonator is widely used as the reception filter of a duplexer. If the coupling capacitor such as the one disclosed in Japanese Unexamined Patent Application Publication No. 2004-96250 is provided in a transmission filter, there is a problem in that isolation characteristics in the pass band of such a transmission filter are degraded. Further, there is also a problem in that attenuation outside of the pass band of a reception filter is not sufficiently increased.

SUMMARY OF THE INVENTION

Preferred embodiments of the present invention provide a duplexer in which isolation characteristics in a pass band of a transmission filter are improved and out-of-band attenuation in a vicinity of the pass band of a reception filter is sufficiently increased.

Preferred embodiments of the present invention provide a duplexer including an antenna terminal, a transmission terminal, a reception terminal, a transmission filter and a reception filter. The transmission filter is connected between the antenna terminal and the transmission terminal. The transmission filter has a ladder circuit configuration including a plurality of elastic wave resonators.

The reception filter includes a longitudinally coupled resonator-type filter portion connected between the antenna terminal and the reception terminal and a ladder filter portion connected between the longitudinally coupled resonator-type filter and the antenna terminal.

In a preferred embodiment of the present invention, the transmission filter includes a first series arm resonator, a first parallel arm resonator, and an inductor connected between the first parallel arm resonator and a ground potential. The ladder filter portion includes at least two second series arm resonators and a second parallel arm resonator. In a preferred embodiment of the present invention, the duplexer further includes a coupling capacitor or an elastic wave resonator. The coupling capacitor or the elastic wave resonator is connected between a wiring line connecting the second series arm resonators of the ladder filter portion to each other and an end portion of the inductor nearer to the first parallel arm resonator.

In another specific aspect of a duplexer according to a preferred embodiment of the present invention, a piezoelectric substrate is further provided, and the transmission filter with the ladder circuit configuration, the reception filter, and the coupling capacitor or the elastic wave resonator are provided on the piezoelectric substrate.

In further another specific aspect of a duplexer according to a preferred embodiment of the present invention, the parallel arm resonator is one of a plurality of parallel arm resonators included in the transmission filter and the inductor is one of a plurality of inductors included in the transmission filter, and the coupling capacitor is connected between an inductor closest to the antenna terminal among the plurality of inductors and the wiring line.

In further another specific aspect of a duplexer according to a preferred embodiment of the present invention, the second series arm resonators and the second parallel arm resonator include elastic wave resonators.

In further another specific aspect of a duplexer according to a preferred embodiment of the present invention, the coupling capacitor includes a capacitor device provided on the piezoelectric substrate.

In further another specific aspect of a duplexer according to a preferred embodiment of the present invention, the capacitor device includes a pair of comb-shaped electrodes provided on the piezoelectric substrate.

In a duplexer according to a preferred embodiment of the present invention, since a coupling capacitor or an elastic wave resonator is connected in a manner described above, not only is the attenuation in the vicinity of the high-frequency side of the pass band of a transmission filter increased but also isolation characteristics in the pass band of the transmission filter are enhanced and the attenuation outside of the pass band of a reception filter is increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

Figure 1:
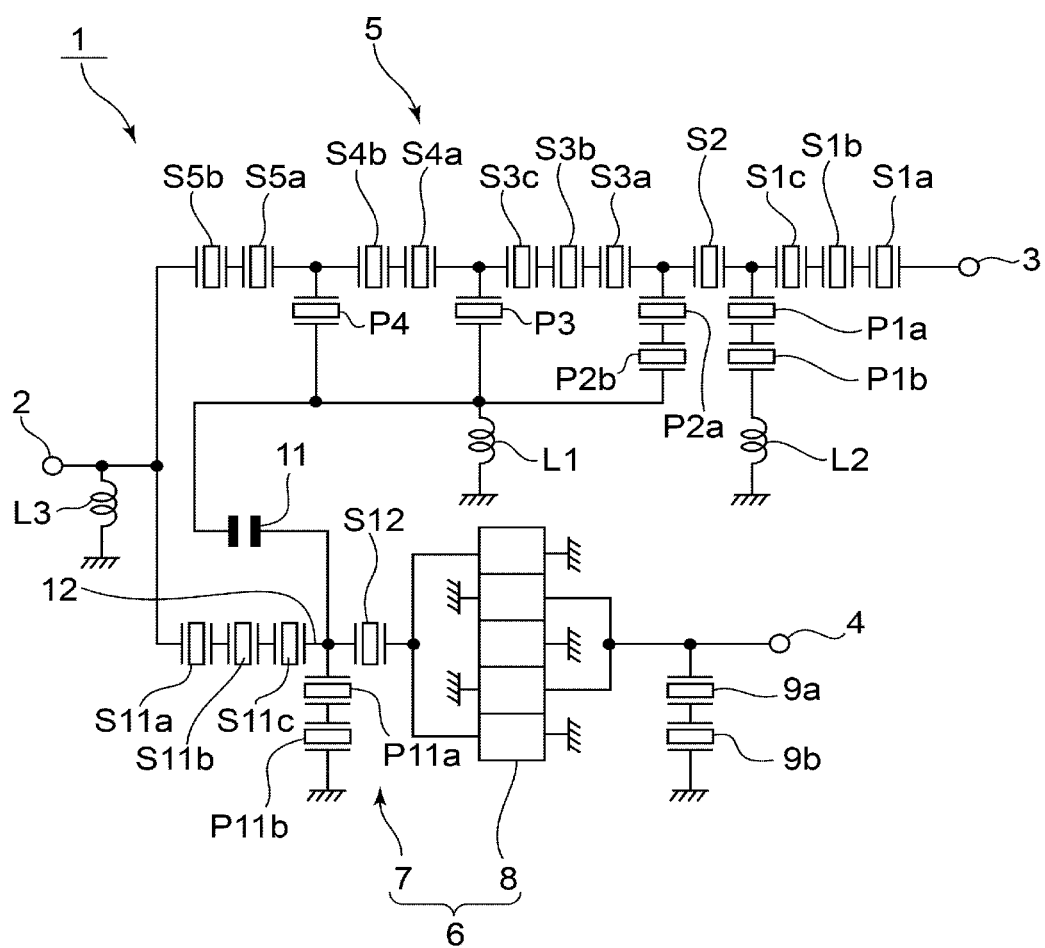
FIG. 1 is a circuit diagram of a duplexer according to a first preferred embodiment of the present invention.
Figure 2:
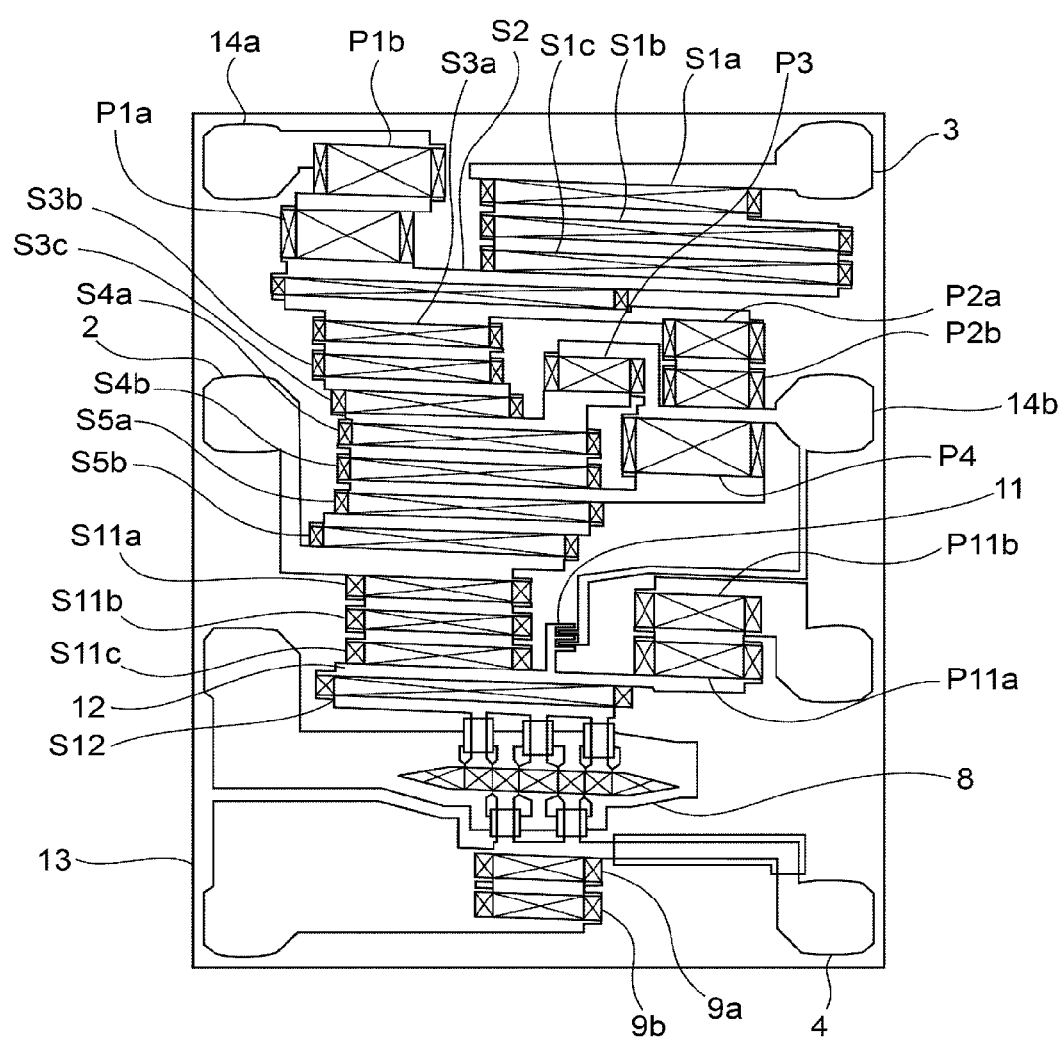
FIG. 2 is a schematic plan view of the duplexer of the first preferred embodiment of the present invention.

FIG. 1 is a circuit diagram of a duplexer according to a first preferred embodiment of the present invention. FIG. 2 is a schematic plan view of the duplexer of the present preferred embodiment.

A duplexer 1 includes an antenna terminal 2, a transmission terminal 3, and a reception terminal 4. A transmission filter 5 is connected between the antenna terminal and the transmission terminal 3. The transmission filter 5 includes a ladder filter. In other words, the transmission filter 5 includes a plurality of series-arm resonators S1a, S1b, S1c to S5a, and S5b which are arranged in this order from the transmission terminal 3 side. In other words, the plurality of first series-arm resonators S1a, S1b, S1c to S5a, and S5b are connected in series with one another on a series arm connecting the antenna terminal 2 to the transmission terminal 3. First to fourth parallel arms are connected between the series arm and a ground potential.

The first to fourth parallel arms are arranged in such a manner that the first parallel arm is near the transmission terminal 3 and the fourth parallel arm is far from the transmission terminal 3. Parallel arm resonators P1a and P1b are connected in series with one another on the first parallel arm. One end of the parallel arm resonator P1a is connected to a connection node between the series-arm resonator S1c and the series-arm resonator S2. The parallel arm resonator P1b is connected to the ground potential through an inductor L2.

The second parallel arm is connected between a connection node between the series-arm resonator S2 and the series-arm resonator S3a and an inductor L1. A parallel arm resonator P2a and a parallel arm resonator P2b are connected in series with each other on the second parallel arm.

The third parallel arm is connected between a connection node between the series-arm resonator S3c and the series-arm resonator S4a and the ground potential. A parallel arm resonator P3 is provided on the third parallel arm. The parallel arm resonator P3 is connected to the ground potential through the inductor L1.

The fourth parallel arm is connected between a connection node between the series-arm resonator S4b and the series-arm resonator S5a and the ground potential. A parallel arm resonator P4 is provided on the fourth parallel arm. The ground-potential-side end portion of the parallel arm resonator P4, the parallel arm resonator P2b, and the parallel arm resonator P3 are connected to one another and are connected to the inductor L1.

The parallel arm resonators P1a to P4 are first parallel arm resonators.

A reception filter 6 is connected between the antenna terminal 2 and the reception terminal 4. The reception filter 6 includes a ladder filter portion 7 and a longitudinally coupled resonator-type surface acoustic wave filter 8. One end of the ladder filter portion 7 is connected to the antenna terminal 2, and the other end is connected to the longitudinally coupled resonator-type surface acoustic wave filter 8.

The ladder filter portion 7 includes series arm resonators S11a to S11c and S12 defining and functioning as second series arm resonators, and parallel arm resonators P11a and P11b defining and functioning as second parallel arm resonators. In various preferred embodiments of the present invention, the ladder filter portion 7 may include five or more of the second series arm resonators. Similarly, three or more of the second parallel arm resonators may be provided. Further, a plurality of parallel arms including parallel arm resonators may be provided.

The longitudinally coupled resonator-type surface acoustic wave filter 8 defines a band pass filter portion. Although the longitudinally coupled resonator-type surface acoustic wave filter 8 is an unbalanced-type filter device, a longitudinally coupled resonator-type surface acoustic wave filter having a balanced-unbalanced transforming function may be used.

One end of the longitudinally coupled resonator-type surface acoustic wave filter 8 is connected to the ladder filter portion 7 and the other end is connected to the reception terminal 4.

Note that elastic wave resonators 9a and 9b are connected between the ground potential and a connection node between the reception terminal 4 and the longitudinally coupled resonator-type surface acoustic wave filter 8.

The duplexer 1 of the present preferred embodiment includes a coupling capacitor 11 illustrated in FIG. 1. The coupling capacitor 11 is connected between a wiring line 12, which connects the second series arm resonator S11c to the second series arm resonator S12 in the ladder filter portion 7, and the end portion of the inductor L1 nearer to the parallel arm resonators P2b, P3, and P4.

Specifically, a piezoelectric substrate 13 is included in the duplexer 1, as illustrated in FIG. 2. A piezoelectric monocrystal substrate made of, for example, $LiNbO_3$ or $LiTaO_3$ may be used as the piezoelectric substrate 13. However, a piezoelectric ceramic or the like may be used. Alternatively, the piezoelectric substrate 13 may be a substrate which is formed in such a manner that a high-acoustic-velocity layer is stacked on a support substrate, a low-acoustic-velocity layer is stacked on the high-acoustic-velocity layer, and a piezoelectric layer is stacked on this low-acoustic-velocity layer. Here, the high-acoustic-velocity layer is one in which the acoustic velocity of a propagating bulk wave is higher than the acoustic velocity of an elastic wave propagating in the piezoelectric layer, and the low-acoustic-velocity layer is one in which the acoustic velocity of a propagating bulk wave is lower than the acoustic velocity of a bulk wave propagating in the piezoelectric layer. On the piezoelectric substrate 13, the antenna terminal 2, the transmission terminal 3, and the reception terminal 4 defined by electrode lands are provided in the vicinity of the outer peripheral portion. Further, a plurality of ground terminals 14a and 14b are provided in the vicinity of the outer peripheral portion of the piezoelectric substrate 13.

The series-arm resonators S1a to S5b and the parallel arm resonators P1a to P4 illustrated in FIG. 1 are defined by one-port surface acoustic wave resonators. The one-port surface acoustic wave resonator includes an interdigital transducer (IDT) electrode and reflectors arranged on the two sides of the IDT electrode in the propagation direction of the surface acoustic wave, as is well known. In FIG. 2, a rectangular shape with a cross mark therein indicates an IDT electrode or a reflector.

As illustrated in FIG. 2, the series-arm resonators S1a to S5b and the parallel arm resonators P1a to P4 are connected to the antenna terminal 2 and between the transmission terminal 3 and the ground terminals 14a and 14b.

The inductor L1 is connected between the ground terminal 14b and the ground potential. In other words, the inductor L1 is externally connected to the structure illustrated in FIG. 2. Similarly, the inductor L2 is externally connected in such a manner that one end thereof is connected to the ground terminal 14a. The inductors L1 and L2 can be formed by connecting inductor devices or bonding wires having an inductance component to the ground terminals 14a and 14b, for example.

On the other hand, also in the reception filter 6, a symbol which is a rectangular shape with a cross mark therein similarly indicates a portion in which an IDT electrode or a reflector is formed.

Referring to FIG. 2, in the ladder filter portion, the coupling capacitor 11 is provided between the wiring line 12 connecting the series arm resonator S11c to the series arm resonator S12 and the ground terminal 14b.

More specifically, the coupling capacitor 11 of the present preferred embodiment is defined by a capacitor device including a pair of comb-shaped electrodes.

The pair of comb-shaped electrodes can be easily formed preferably by using a thin film formation method similarly to other wiring lines. Hence, in the present preferred embodiment, the coupling capacitor 11 described above can be easily formed. Further, in the capacitor device including a pair of comb-shaped electrodes, the electrostatic capacitance of a coupling capacitor is easily adjusted by changing the number of the comb-shaped electrodes or the width of the electrode fingers.

However, not limited to a pair of comb-shaped electrodes, the coupling capacitor 11 may include other capacitor devices according to other preferred embodiments of the present invention. Further, the coupling capacitor 11 may be provide with various structures that allow electrostatic capacitance to be generated, and is not limited to a capacitor device.

As described above, the ground terminal 14b corresponds to a portion connected to the parallel arm resonator P4 and the inductor L1. Hence, the coupling capacitor 11 is connected between the wiring line 12 and the end portion of the inductor L1 nearer to the parallel arm resonators P2b, P3, and P4.

In the pair of comb-shaped electrodes defining the coupling capacitor 11, a direction in which the electrode fingers extend is the same as a direction in which a surface acoustic wave propagates on the piezoelectric substrate 13. In other words, directions in which the electrode fingers of IDT electrodes extend in the series-arm resonators S1a to S5b, the parallel arm resonators P1a to P4, the ladder filter portion 7, and the longitudinally coupled resonator-type surface acoustic wave filter 8 are preferably the same. The direction in which the electrode fingers in the pair of comb-shaped electrodes extend is perpendicular or substantially perpendicular to the direction in which the electrode fingers in the IDT electrodes described above extend.

In this manner, it is preferable that a direction in which the electrode fingers of the comb-shaped electrode extend be different from a direction in which the electrode fingers of the IDT electrodes extend, and more preferably, be different by 90 degrees as in the present preferred embodiment, although not specifically limited. This allows an influence from a surface acoustic wave excited by the pair of comb-shaped electrodes to be reduced.

Since the coupling capacitor 11 has a structure as described above in the duplexer 1 of the present preferred embodiment, the isolation characteristics in a transmission band and the attenuation near the pass band of a reception filter are sufficiently enhanced. This will be described below on the basis of a specific example.

A non-limiting example of the duplexer 1 having the specifications described below was produced.
Piezoelectric Substrate 13: LiTaO$_3$ Substrate Table 1 below shows the specifications of the series-arm resonators S1a, S1b, S1c to S5a, and S5b and the specifications of the parallel arm resonators P1a to P4.

TABLE 1

|  |  | S1a-S1c | P1a, P1b | S2 | P2a, P2b | S3a-S3c | P3 | S4a, S4b | P4 | S5a, S5b |
|---|---|---|---|---|---|---|---|---|---|---|
| IDT wavelength | (μm) | 2.0191 | 2.0952 | 2.0063 | 2.0934 | 2.0193 | 2.1029 | 2.0329 | 2.1003 | 2.0214 |
| Reflector wavelength | (μm) | same as IDT | same as IDT | same as IDT | same as IDT | same as IDT | same as IDT | same as IDT | same as IDT | same as IDT |
| Overlap width | (μm) | 30.62 | 58.66 | 30.3 | 56.01 | 30.56 | 55.77 | 30.34 | 75.66 | 30.6 |
| Number of pairs of IDT |  | 265 | 77 | 134 | 70 | 114 | 70 | 180 | 84 | 182 |
| Number of electrode fingers of reflector |  | 21 | 21 | 21 | 21 | 21 | 21 | 21 | 21 | 21 |
| Duty ratio |  | 0.5 | 0.5 | 0.5 | 0.5 | 0.5 | 0.5 | 0.5 | 0.5 | 0.5 |

Inductor devices of 0.2 nH and 0.4 nH were connected as the inductors L1 and L2.

The Specifications of the Ladder Filter Portion 7

Table 2 below shows the specifications of the series arm resonators S11a to S11c and S12 and the parallel arm resonators P11a and P11b.

TABLE 2

|  |  | S11a-S11c | P11a, P11b | S12 |
|---|---|---|---|---|
| IDT wavelength | (μm) | 1.9229 | 1.9839 | 1.9209 |
| Reflector wavelength | (μm) | same as IDT | same as IDT | same as IDT |
| Overlap width | (μm) | 30 | 56.3 | 30 |
| Number of pairs of IDT |  | 125 | 70 | 227 |
| Number of electrode fingers of reflector |  | 31 | 31 | 31 |
| Duty ratio |  | 0.5 | 0.5 | 0.5 |

Table 3 below shows the specifications of the elastic wave resonators 9a and 9b.

TABLE 3

|  |  | 9a, 9b |
|---|---|---|
| IDT wavelength | (μm) | 1.9814 |
| Reflector wavelength | (μm) | same as IDT |
| Overlap width | (μm) | 38 |
| Number of pairs of IDT |  | 70 |
| Number of electrode fingers of reflector |  | 31 |
| Duty ratio |  | 0.5 |

The details of the longitudinally coupled resonator-type surface acoustic wave filter 8 are as follows.

Table 4 and Table 5 show the specifications of the longitudinally coupled resonator-type surface acoustic wave filter 8. Note that the duty ratios of all the reflectors and IDTs were set to 0.5. The overlap width was set to 40 μm. The number of electrode fingers of a reflector was set to 75.

TABLE 4

|  | Wavelength (μm) |
|---|---|
| Reflector | 1.9849 |
| Center portions of first and fifth IDTs | 1.9854 |
| Narrow-pitch portions of first and fifth IDTs | 1.8559 |
| Narrow-pitch portions (outer) of second and fourth IDTs | 1.7809 |
| Center portions of second and fourth IDTs | 1.9399 |
| Narrow-pitch portions (inner) of second and fourth IDTs | 1.8719 |
| Narrow-pitch portion of third IDT | 1.8989 |
| Center portion of third IDT | 1.9744 |

TABLE 5

|  | Number of pairs |
|---|---|
| Center portions of first and fifth IDTs | 19 |
| Narrow-pitch portions of first and fifth IDTs | 1.5 |
| Narrow-pitch portions (outer) of second and fourth IDTs | 1 |
| Center portions of second and fourth IDTs | 14.5 |
| Narrow-pitch portions (inner) of second and fourth IDTs | 3.5 |
| Narrow-pitch portion of third IDT | 4.5 |
| Center portion of third IDT | 22 |

A pair of comb-shaped electrodes having an electrostatic capacitance of 0.25 pF was formed as the coupling capacitor 11. An Al layer including Cu was used as an electrode layer.

For comparison, a duplexer of a first comparative example configured similarly to the example described above except that the coupling capacitor 11 is not provided was formed.

Figure 4:
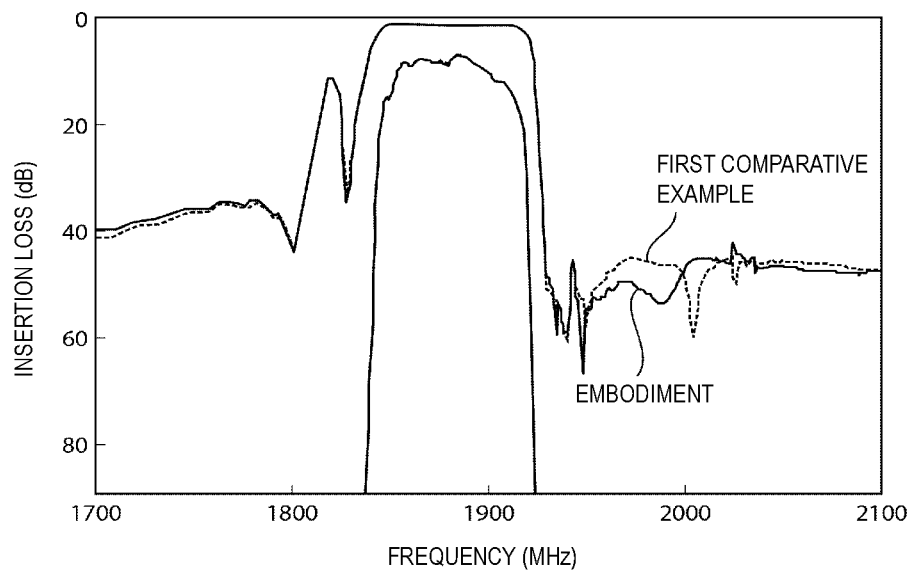
FIG. 4 is a diagram illustrating the attenuation frequency characteristics of the reception filters of the first preferred embodiment and the first comparative example.
Figure 5:
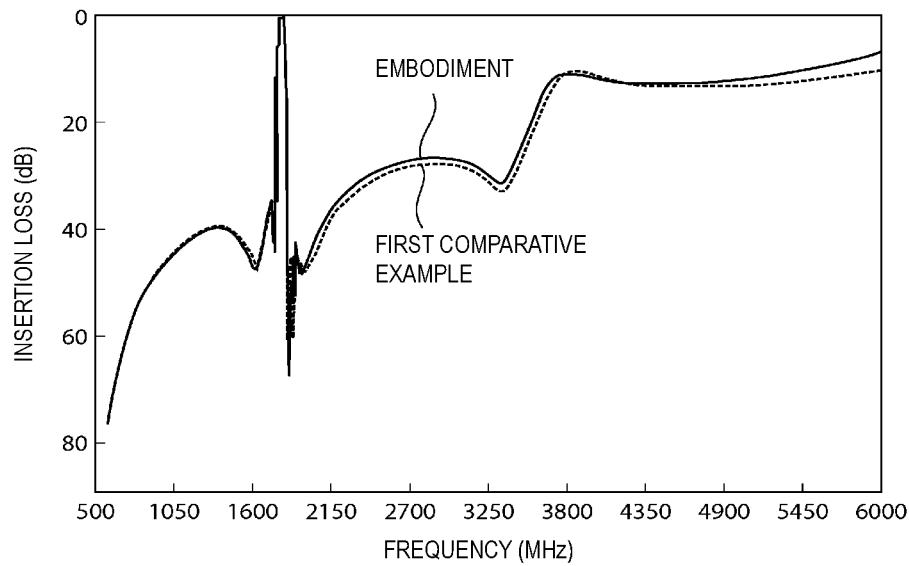
FIG. 5 is a diagram illustrating the attenuation frequency characteristics of the reception filters of the first preferred embodiment and the first comparative example.

The isolation characteristics of duplexers of the example and the first comparative example prepared in the manner described above are illustrated in FIG. 3. FIG. 4 and FIG. 5 illustrate the attenuation frequency characteristics of the reception filters in the example and the first comparative example.

Note that in the present example, a duplexer of Band 25 was formed. Hence, the pass band of the transmission filter is about 1850 MHz to about 1915 MHz, and the pass band of the reception filter is about 1930 MHz to about 1995 MHz.

Figure 3:
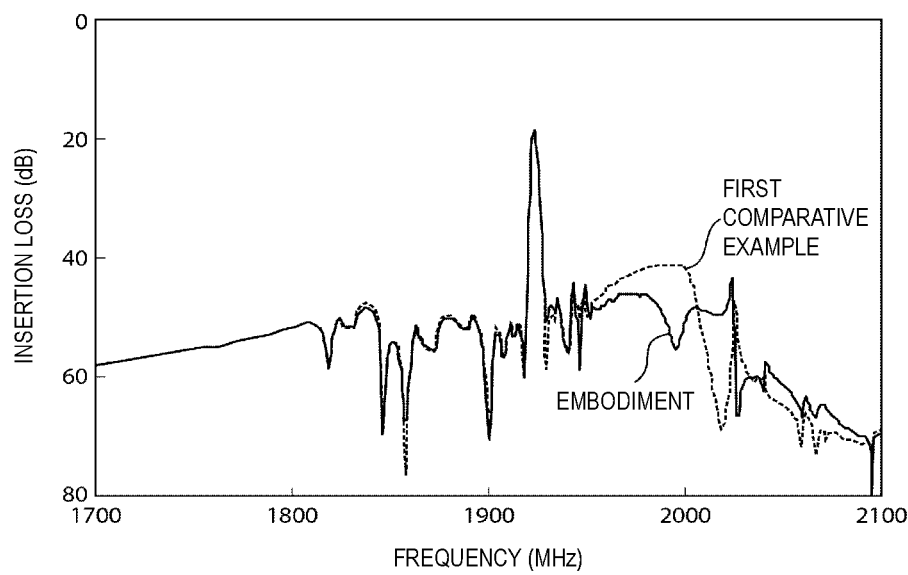
FIG. 3 is a diagram illustrating the isolation characteristics of the first preferred embodiment and a first comparative example.

As is clear from FIG. 3, when the isolation characteristics of the above example and the isolation characteristics of the first comparative example are compared, isolation in the pass band of the reception filter according to the example is considerably improved, compared with the first comparative example. On the other hand, as illustrated in FIG. 4 and FIG. 5, the insertion loss in the example within the pass band of the transmission filter is not substantially different from the first comparative example. Further, it can be seen that the positions, in terms of frequency, of the attenuation poles outside of the pass band negligibly change.

Figure 6:
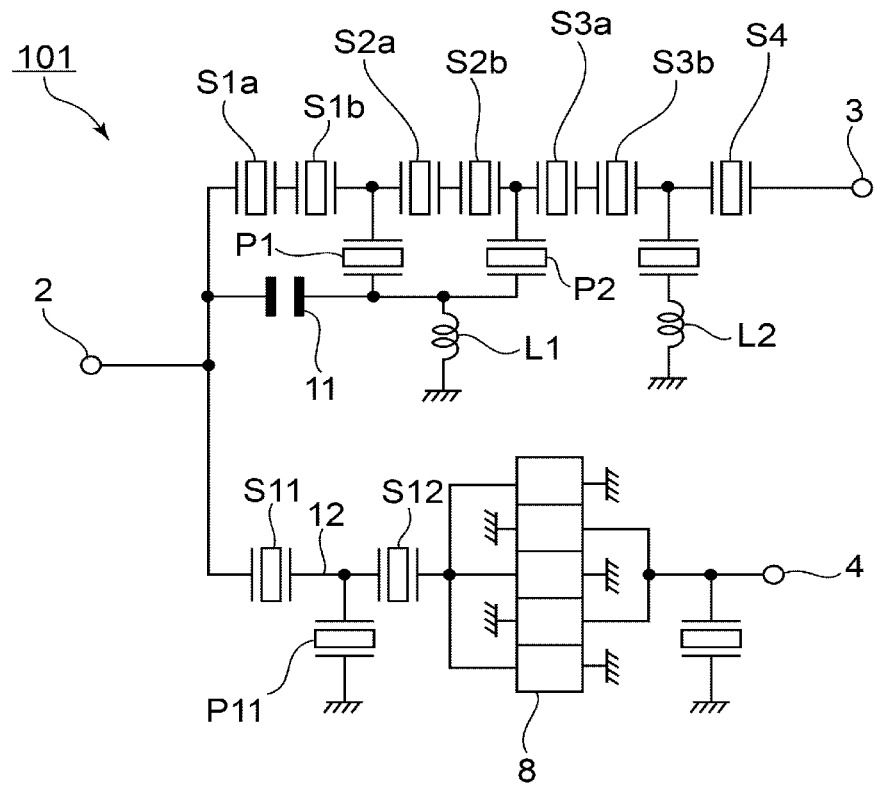
FIG. 6 is a circuit diagram of a duplexer of a second comparative example.

Next, a duplexer 101 having a circuit configuration illustrated in FIG. 6 was prepared as a second comparative example. In the duplexer 101, the coupling capacitor 11 is connected between the antenna terminal 2 and the end portion of the inductor L1 nearer to the parallel arm resonators P1 and P2.

Figure 7:
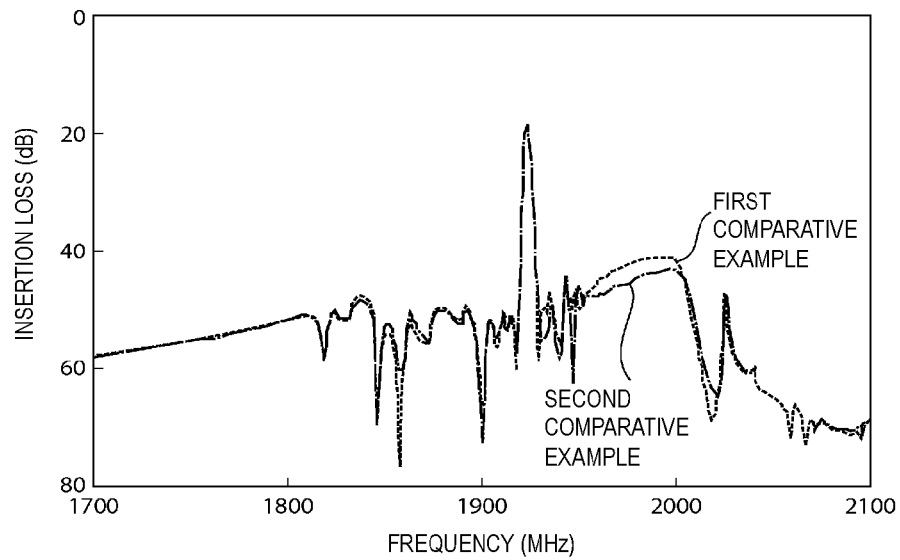
FIG. 7 is a diagram illustrating the isolation characteristics of the first comparative example and the second comparative example.
Figure 8:
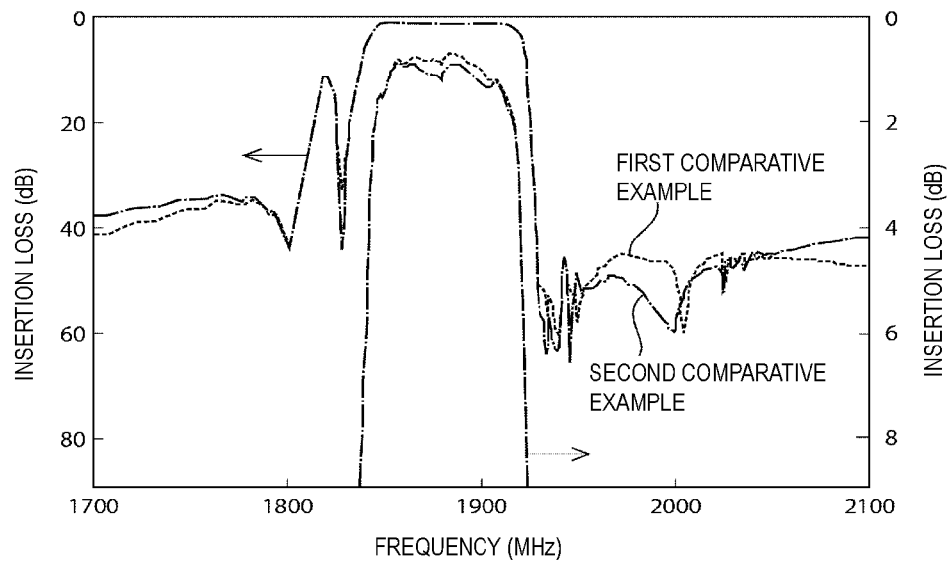
FIG. 8 is a diagram illustrating the filter characteristics of transmission filters in the duplexers of the first and second comparative examples.
Figure 9:
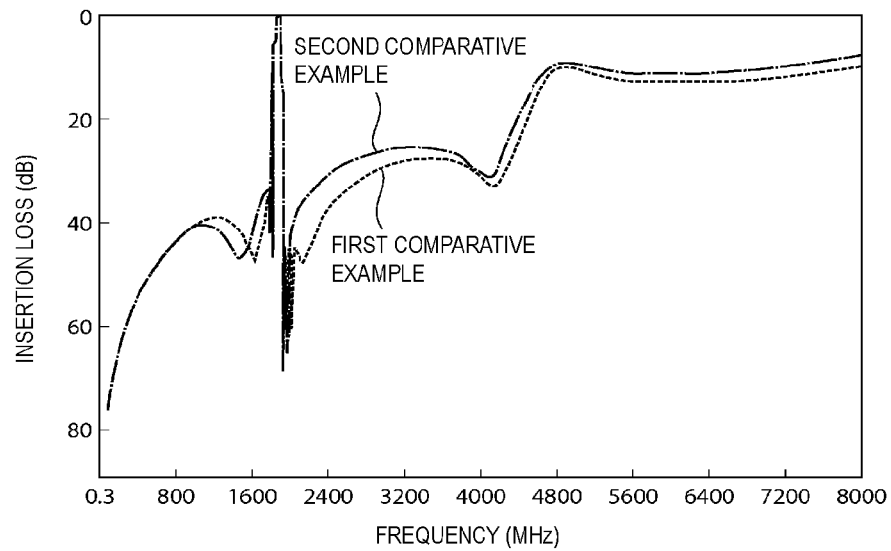
FIG. 9 is a diagrams illustrating the filter characteristics of the transmission filters in the duplexers of the first and second comparative examples.

FIG. 7 is a diagram illustrating the isolation characteristics of the second comparative example prepared as described above and the first comparative example which does not include the coupling capacitor 11. FIG. 8 and FIG. 9 are diagrams illustrating the attenuation frequency characteristics of the transmission filters of the first and second comparative examples.

Note that the electrostatic capacitance of the coupling capacitor 11 in the second comparative example was set to 0.5 pF. As is clear from FIG. 7 to FIG. 9, the isolation in the pass band of the reception filter has been improved but the loss within the pass band of the transmission filter has been degraded, in the second comparative example. Further, it can be seen that the position, in terms of frequency, of the attenuation poles outside of the pass band of the transmission filter have shifted and, hence, the attenuation characteristics have been degraded.

The reason why the isolation characteristics are able to be improved and the degradation of the attenuation characteristics outside of the pass band of the transmission filter is able to be significantly reduced or prevented in the example described above, compared with the first comparative example and the second comparative example, is thought to be as follows.

When a coupling capacitor is added to a transmission filter, isolation in the pass band of a reception filter is improved. However, when the coupling capacitor is provided within the transmission filter, the loss in the pass band in the transmission filter may be increased, thus possibly causing degradation. In addition, attenuation poles outside of the pass band are shifted to the low-frequency side, causing degradation of the attenuation characteristics outside of the band. Such degradation of loss is caused by the fact that impedance matching within the transmission filter is degraded. Further, it is thought that the positions, in terms of frequency, of the attenuation poles are shifted because resonance generated by the parallel arm resonators and the inductor connected in series with the parallel arm resonators adds an additional coupling capacitor.

In the present preferred embodiment and example described above, in the reception filter, the ladder filter portion 7 is provided between the antenna terminal and the longitudinally coupled resonator-type surface acoustic wave filter, and the coupling capacitor 11 is provided between the wiring line 12 connecting the series arm resonators S11c and S12 of the ladder filter portion 7 to each other and the inductor L1. Hence, a current flows to the reception filter side because the coupling capacitor 11 is provided between the reception filter and the transmission filter. As a result, the coupling capacitor 11 is unlikely to influence the transmission filter. Hence, degradation of the impedance matching in the transmission filter is unlikely to be generated. Further, a shift in the positions, in terms of frequency, of the attenuation poles outside of the pass band of the transmission filter is effectively reduced or prevented.

Figure 10:
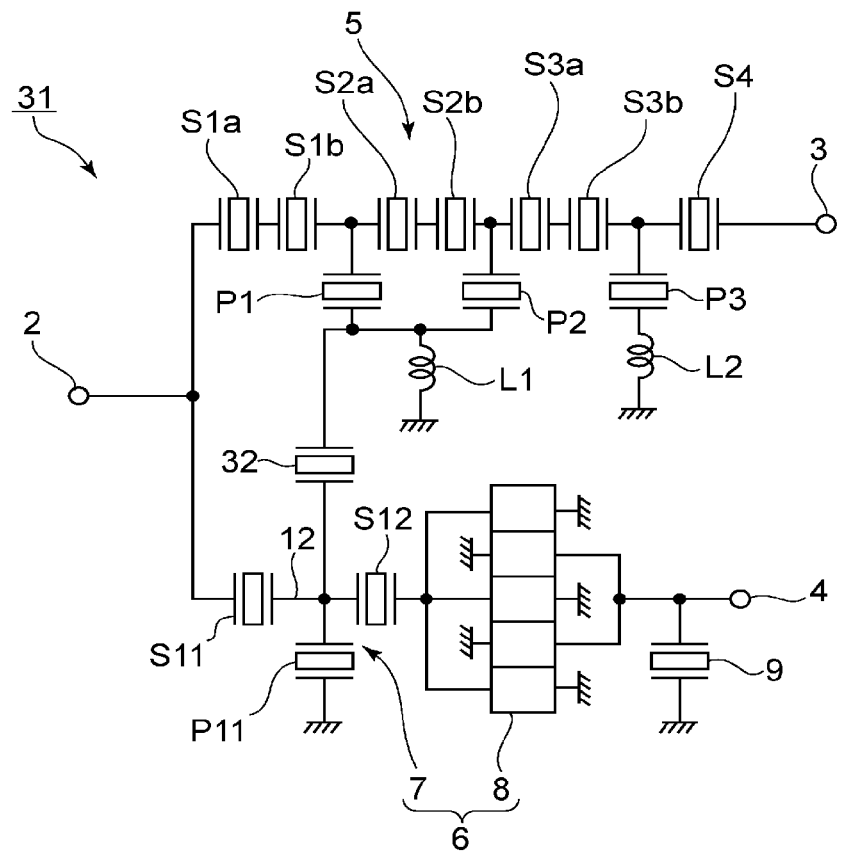
FIG. 10 is a circuit diagram of a duplexer according to a second preferred embodiment of the present invention.

FIG. 10 is a circuit diagram of a duplexer 31 according to a second preferred embodiment of the present invention.

In the duplexer 31 of the second preferred embodiment, an elastic wave resonator 32 is included instead of the coupling capacitor 11. The elastic wave resonator 32 preferably is a one-port-type surface acoustic wave resonator, but may be a boundary acoustic wave resonator. The rest of the configuration of the second preferred embodiment is approximately the same as that of the first preferred embodiment, although slightly different from the first preferred embodiment in terms of, for example, the configuration of the ladder filter portion 7. Series-arm resonators S1a and S1b to S4 are connected in series to the antenna terminal 2 in this order. Note that identical portions are denoted by the same reference symbols and descriptions thereof are omitted.

As in the present preferred embodiment, the elastic wave resonator 32, instead of the coupling capacitor 11, may be connected between the wiring line 12 and the end portion of the inductor L1 nearer to the parallel arm resonators P1 and P2. Also in this case, when an elastic wave resonator 22 is connected in such a manner as to function as a capacitor, isolation in a reception band is improved similarly to the first preferred embodiment described above. In addition, an increase in loss within a pass band in the transmission filter is suppressed or prevented and, further, a shift of the positions, in terms of frequency, of attenuation poles outside of the pass band of the transmission filter is suppressed or prevented.

Figure 11:
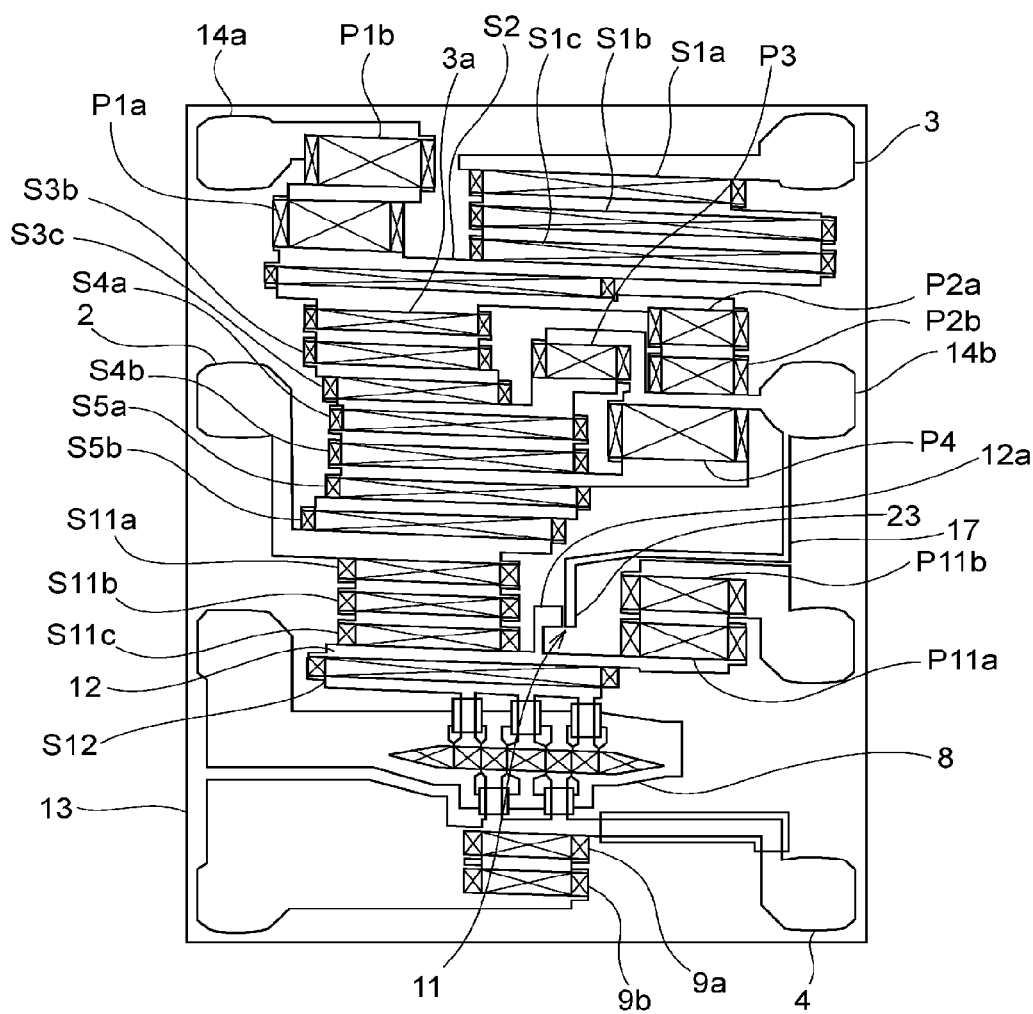
FIG. 11 is a schematic plan view of a first modification of the duplexer according to the first preferred embodiment of the present invention.

FIG. 11 is a schematic plan view of a duplexer according to a first modification of the first preferred embodiment of the present invention. In the present modification, the coupling capacitor 11 includes a capacitor-forming electrode portion 12a connected to the wiring line 12 and a capacitor-forming electrode portion 23 facing the capacitor-forming electrode portion 12a with a gap therebetween, instead of a pair of comb-shaped electrodes. The capacitor-forming electrode portion 23 is connected to a wiring line 17 connected to the ground terminal 14b. In this manner, the coupling capacitor 11 may include electrode patterns facing each other with a gap therebetween instead of a pair of comb-shaped electrodes. The coupling capacitor 11 may be the capacitor-forming electrode portions 12a and 23 described above in the case of a small electrostatic capacitance.

Figure 12:
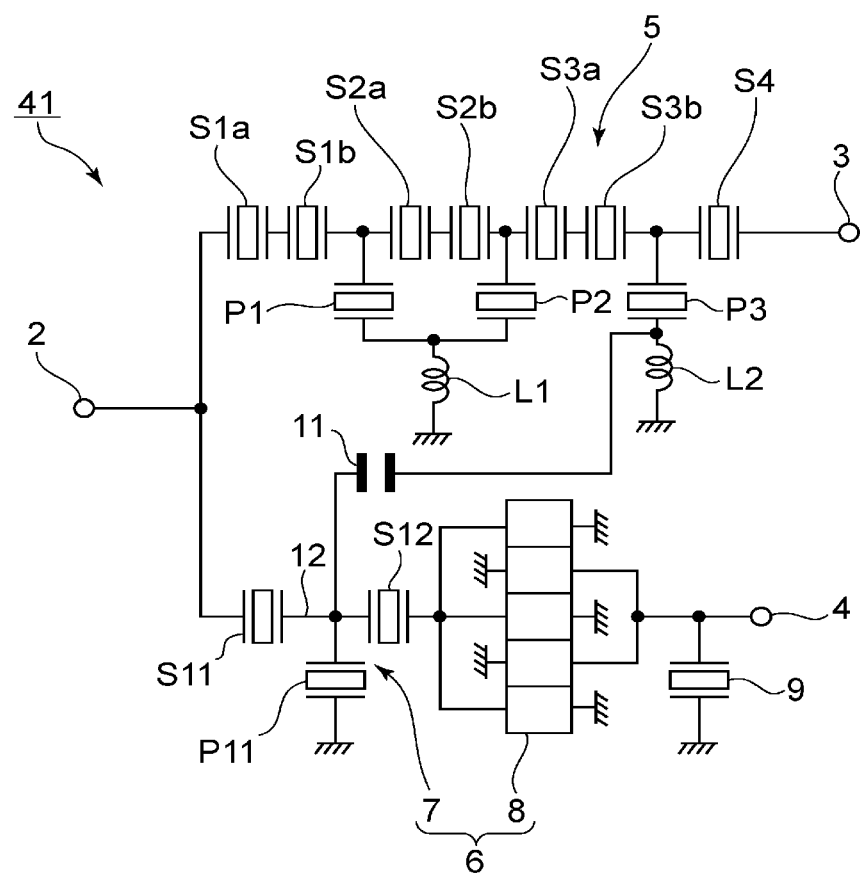
FIG. 12 is a circuit diagram of a second modification of the duplexer according to the first preferred embodiment of the present invention.

FIG. 12 is a circuit diagram illustrating a second modification of the first preferred embodiment of the present invention. In a duplexer 41 of the present modification, the coupling capacitor 11 is connected between the wiring line 12 and the end portion of the inductor L2 nearer to the parallel arm resonator P3, rather than connected to the inductor L1. In this manner, the coupling capacitor 11 may be connected to the end portion of the inductor L2 nearer to the parallel arm resonator P3 rather than to the inductor L1. In other words, an inductor including an end portion connected to a coupling capacitor is not specifically limited as long as the inductor is connected between a parallel arm resonator and the ground potential.

However, it is preferable that the coupling capacitor 11 be connected to the inductor L1 closest to the antenna terminal. This further enhances the isolation characteristics.

Figure 13:
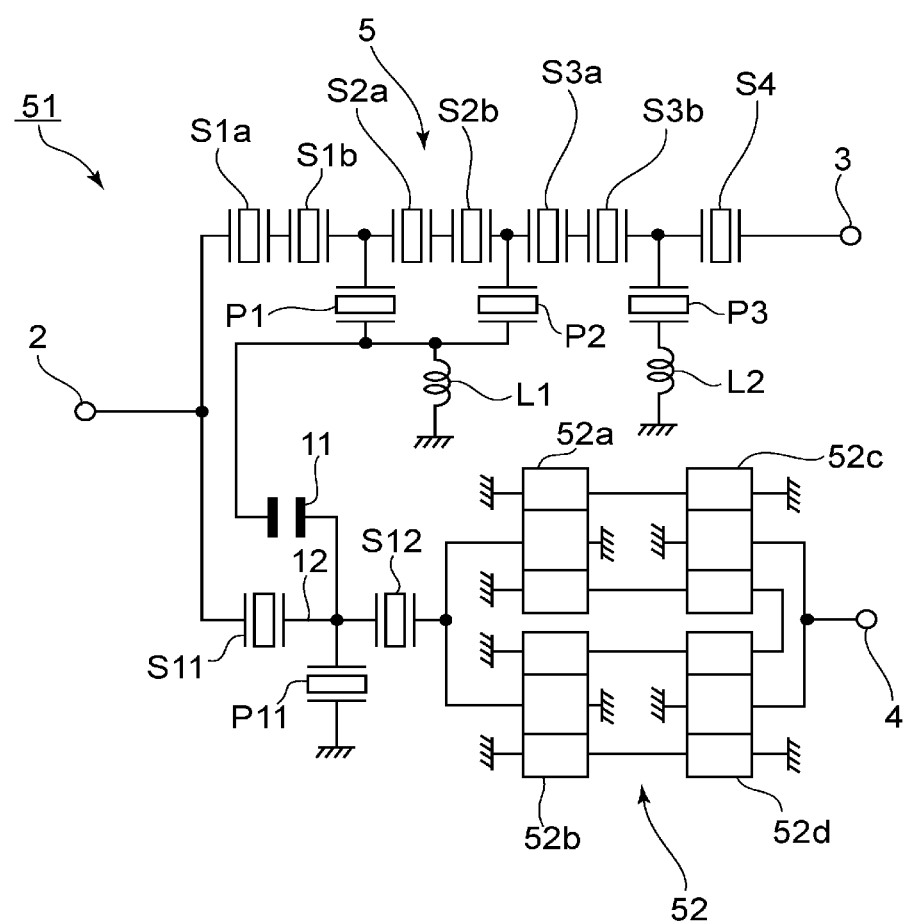
FIG. 13 is a circuit diagram of a third modification of the duplexer according to the first preferred embodiment of the present invention.

FIG. 13 is a circuit diagram illustrating a third modification of the duplexer of the first preferred embodiment of the present invention. In a duplexer 51 of the present modification, a longitudinally coupled resonator-type surface acoustic wave filter 52 including first to fourth longitudinally coupled resonator-type surface acoustic wave filter portions 52a to 52d is used, instead of the longitudinally coupled resonator-type surface acoustic wave filter 8. The longitudinally coupled resonator-type surface acoustic wave filter portions 52a to 52d are all three-IDT longitudinally coupled resonator-type surface acoustic wave filter portions. Note that a preferred embodiment of a longitudinally coupled resonator-type surface acoustic wave filter portion is not specifically limited as long as it has a configuration in which two or more IDTs sandwiched between two reflectors are arranged in the propagation direction of a surface acoustic wave. For example, it may be a longitudinally coupled resonator-type surface acoustic wave filter portion including five IDTs.

In this manner, the configuration of each of the longitudinally coupled resonator-type surface acoustic wave filter portions defining a reception filter is not specifically limited. Further, as described above, the reception filter may include longitudinally coupled resonator-type surface acoustic wave filters having a balanced-unbalanced transforming function. In that case, first and second balanced terminals constitute a reception terminal.

The configuration of a ladder filter defining a transmission filter in a duplexer according to the present invention is not limited to the preferred embodiments and modifications described above either. In other words, a ladder filter having any number of stages may be included. However, it is preferably to include a ladder filter having a configuration in which an inductor is connected between a parallel arm resonator and a ground potential. A coupling capacitor or an elastic wave resonator preferably is connected between one end of the inductor and the wiring line 12 described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A duplexer comprising:
an antenna terminal;
a transmission terminal;
a reception terminal;
a transmission filter that is connected between the antenna terminal and the transmission terminal and that has a ladder circuit configuration including a plurality of elastic wave resonators;
a reception filter including a longitudinally coupled resonator filter portion connected between the antenna terminal and the reception terminal and a ladder filter portion connected between the longitudinally coupled resonator filter portion and the antenna terminal; wherein the transmission filter includes a first series arm resonator, a first parallel arm resonator, and an inductor connected between the first parallel arm resonator and a ground potential;

the ladder filter portion includes at least two second series arm resonators and a second parallel arm resonator; and the duplexer further includes a coupling capacitor or an elastic wave resonator connected between a wiring line connecting the second series arm resonators of the ladder filter portion to each other and an end portion of the inductor nearer to the first parallel arm resonator.

2. The duplexer according to claim 1 further comprising:
a piezoelectric substrate; wherein
the transmission filter, the reception filter, and the coupling capacitor or the elastic wave resonator are provided on the piezoelectric substrate.

3. The duplexer according to claim 2, wherein the coupling capacitor is a capacitor device provided on the piezoelectric substrate.

4. The duplexer according to claim 3, wherein the capacitor device includes a pair of comb-shaped electrodes provided on the piezoelectric substrate.

5. The duplexer according to claim 2, wherein the coupling capacitor includes a capacitor element including a pair of comb electrodes provided on the piezoelectric substrate.

6. The duplexer according to claim 5, wherein in the pair of comb electrodes of the coupling capacitor, a direction in which electrode fingers extend is parallel or substantially parallel to a direction in which a surface acoustic wave is propagated on the piezoelectric substrate.

7. The duplexer according to claim 5, wherein the direction in which the electrode fingers of the pair of comb electrodes extend is perpendicular or substantially perpendicular to the direction in which electrode fingers of each interdigital transducers electrode extend in the first series arm resonator, the first parallel arm resonator, the ladder filter portion, and the longitudinally coupled resonator filter portion.

8. The duplexer according to claim 1, wherein the first parallel arm resonator is one of a plurality of first parallel arm resonators included in the transmission filter and the inductor is one of a plurality of inductors included in the transmission filter, and the coupling capacitor is connected between an inductor closest to the antenna terminal among the plurality of inductors and the wiring line.

9. The duplexer according to claim 1, wherein the second series arm resonators and the second parallel arm resonator are elastic wave resonators.

10. The duplexer according to claim 1, wherein the first series arm resonator is one of a plurality of first series arm resonators connected in series with one another on a series arm connecting the antenna terminal to the transmission terminal.

11. The duplexer according to claim 1, wherein a plurality of parallel arms are connected between a series arm and the ground potential.

12. The duplexer according to claim 1, wherein the longitudinally coupled resonator filter portion is a longitudinally coupled resonator surface acoustic wave filter.

13. The duplexer according to claim 1, wherein the ladder filter portion includes at least five second series arm resonators and at least three second parallel arm resonators.

14. The duplexer according to claim 1, wherein the longitudinally coupled resonator filter portion defines a band pass filter portion.

15. The duplexer according to claim 1, wherein the longitudinally coupled resonator filter portion defines one of an unbalanced filter device and a longitudinally coupled resonator surface acoustic wave filter having a balanced-unbalanced transforming function.

16. The duplexer according to claim 1, wherein the first series resonator and the first parallel arm resonator are one-port surface acoustic wave resonators.

17. The duplexer according to claim 1, wherein the elastic wave resonator includes one of a one-port surface acoustic wave resonator and a boundary acoustic wave resonator.

18. The duplexer according to claim 1, wherein the coupling capacitor includes a capacitor-forming electrode portion connected to the line and another capacitor-forming electrode portion opposing the capacitor-forming electrode portion across a gap.

* * * * *